(12) United States Patent
Tay et al.

(10) Patent No.: US 10,973,133 B2
(45) Date of Patent: *Apr. 6, 2021

(54) SACRIFICIAL STRUCTURE WITH DUMMY CORE AND TWO SECTIONS OF SEPARATE MATERIAL THEREON FOR MANUFACTURING COMPONENT CARRIERS

(71) Applicant: AT&S (China) Co. Ltd., Shanghai (CN)

(72) Inventors: Annie Tay, Singapore (SG); Nikolaus Bauer-Oeppinger, Gramastetten (AT); Giordano DiGregorio, Shanghai (CN); Philips Dai, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 264 days.

This patent is subject to a terminal disclaimer.

(21) Appl. No.: 15/760,487

(22) PCT Filed: Sep. 16, 2016

(86) PCT No.: PCT/IB2016/055544
§ 371 (c)(1),
(2) Date: Mar. 15, 2018

(87) PCT Pub. No.: WO2017/046764
PCT Pub. Date: Mar. 23, 2017

(65) Prior Publication Data
US 2018/0255649 A1 Sep. 6, 2018

(30) Foreign Application Priority Data
Sep. 17, 2015 (CN) .......................... 201510594041.2

(51) Int. Cl.
*H05K 1/18* (2006.01)
*H05K 3/46* (2006.01)
(Continued)

(52) U.S. Cl.
CPC ......... *H05K 3/4682* (2013.01); *H05K 3/0097* (2013.01); *H05K 3/022* (2013.01);
(Continued)

(58) Field of Classification Search
USPC ...................................................... 361/761
See application file for complete search history.

(56) References Cited

U.S. PATENT DOCUMENTS

| 8,227,771 | B2 | 7/2012 | Soer et al. |
| 2007/0124924 | A1 | 6/2007 | Nakamura |

(Continued)

FOREIGN PATENT DOCUMENTS

| CN | 101257775 A | 9/2008 |
| CN | 101472408 A | 7/2009 |

(Continued)

OTHER PUBLICATIONS

SIPO, Office Action, Application No. 201510594041.2, dated Aug. 31, 2018, 23 pp. (translated).

(Continued)

*Primary Examiner* — Andargie M Aychillhum
(74) *Attorney, Agent, or Firm* — Robert A. Blaha; Smith Tempel Blaha LLC

(57) ABSTRACT

A semifinished product with a sacrificial structure and two component carriers releasably formed on opposing main surfaces of the sacrificial structure. The sacrificial structure includes a central structure and releasing layers on or over both opposing main surfaces of the central structure The central structure includes a dummy core being covered, in particular fully, on or over both main surfaces thereof with (Continued)

a respective one of two spatially separated sections of separate material, in particular separate dielectric material.

20 Claims, 3 Drawing Sheets

(51) Int. Cl.
| | | |
|---|---|---|
| *H05K 3/00* | (2006.01) | |
| *H05K 3/02* | (2006.01) | |
| *H05K 3/32* | (2006.01) | |
| *H05K 3/40* | (2006.01) | |
| *H05K 1/02* | (2006.01) | |
| *H05K 3/10* | (2006.01) | |

(52) U.S. Cl.
CPC ............ *H05K 3/32* (2013.01); *H05K 3/4007* (2013.01); *H05K 1/0269* (2013.01); *H05K 1/0271* (2013.01); *H05K 3/108* (2013.01); *H05K 3/4638* (2013.01); *H05K 2201/068* (2013.01); *H05K 2201/09918* (2013.01); *H05K 2201/09936* (2013.01); *H05K 2203/0156* (2013.01); *H05K 2203/0264* (2013.01); *H05K 2203/1536* (2013.01)

(56) References Cited

U.S. PATENT DOCUMENTS

| | | | | |
|---|---|---|---|---|
| 2008/0280032 | A1* | 11/2008 | Chen | ........................... 427/97.3 |
| 2010/0139964 | A1 | 6/2010 | An et al. | |
| 2010/0159765 | A1 | 6/2010 | Jian et al. | |
| 2012/0079716 | A1 | 4/2012 | Oh et al. | |
| 2012/0279765 | A1 | 11/2012 | Samejima et al. | |
| 2012/0280032 | A1 | 11/2012 | Samejima et al. | |
| 2015/0003000 | A1 | 1/2015 | Manepalli et al. | |
| 2017/0235047 | A1* | 8/2017 | Kitazoe | ................. G02B 6/132 385/131 |

FOREIGN PATENT DOCUMENTS

| | | |
|---|---|---|
| CN | 102098882 A | 6/2011 |
| CN | 102448250 A | 5/2012 |
| CN | 102970828 A | 3/2013 |
| JP | H09100357 A | 4/1997 |
| JP | 2006-332115 A | 12/2006 |
| WO | WO2013183604 A1 | 12/2013 |
| WO | WO2014054803 A1 | 4/2014 |

OTHER PUBLICATIONS

European Patent Office, Extended European Search Report, Application No. 16845819.8; dated Apr. 8, 2019; 83 pp.; Munich, Germany.

Tomezak, A.; Communication Pursuant to Article 94(3) EPC in Application No. 16 845 819.8; pp. 1-8; Feb. 10, 2021; European Patent Office, Postbus 5818, 2280 Rijswijk, Netherlands.

Anonymous; IPC-TM-650 Test Methods Manual, pp. 1-3; Aug. 1997; The Institute for Interconnecting and Packaging Electronic Circuits; XP 055770388A; Northbrook, Illinois 60062-6135.

\* cited by examiner

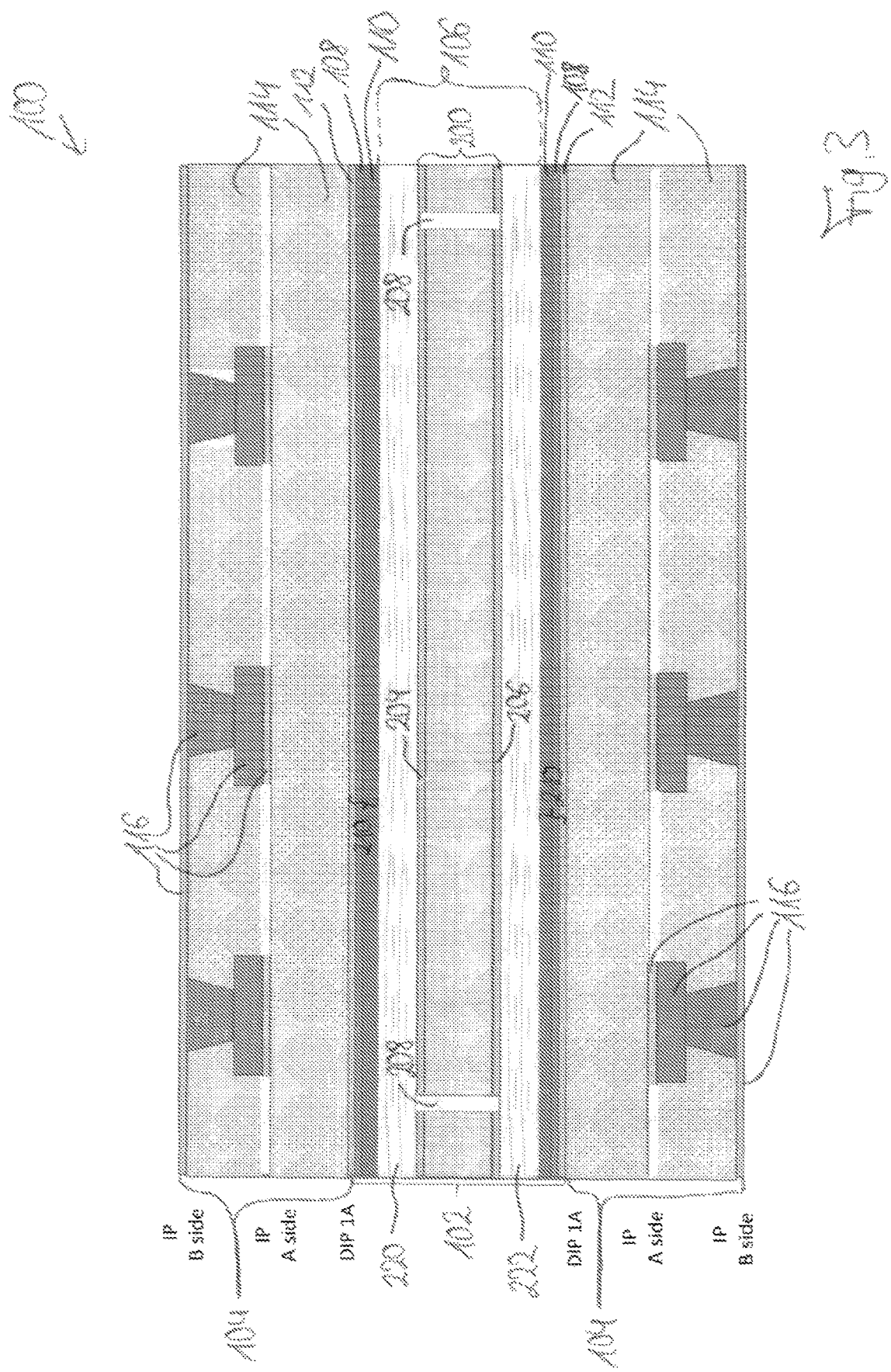

SACRIFICIAL STRUCTURE WITH DUMMY CORE AND TWO SECTIONS OF SEPARATE MATERIAL THEREON FOR MANUFACTURING COMPONENT CARRIERS

CROSS-REFERENCE TO RELATED APPLICATIONS

This application is a national phase application, which is derived from international patent application number PCT/IB2016/055544, filed on Sep. 16, 2016, and which claims the benefit of the filing date of China patent application number CN 201510594041.4, filed Sep. 17, 2015, the disclosures of which are hereby incorporated by reference in their entirety.

TECHNICAL FIELD

The present invention relates to a semifinished product. Furthermore, the invention relates to a method of manufacturing component carriers.

TECHNOLOGICAL BACKGROUND

Along with the development of electronic industries, electronic products have a trend towards miniaturization and high performance, and accordingly multi-layer boards are developed so as to increase the layout area for the layout through interlayer connection techniques, and meet demands for high-density integrated circuits and meanwhile reduce the thickness of packaging substrates.

Conventionally, a component carrier comprises a core board and built-up structures disposed on two sides of the core board. However, the use of the core board increases the length of wires and thickness of the overall structure. Accordingly, coreless component carriers are developed to overcome these drawbacks, thereby meeting the developmental trend of high frequency and miniaturization.

U.S. Pat. No. 8,227,711 discloses a coreless packaging substrate which includes a substrate body including an auxiliary dielectric layer having opposing first and second surfaces, an inner wiring formed on the second surface, and a built-up structure formed on both the second surface of the auxiliary dielectric layer and the inner wiring. A plurality of conductive bumps including metal pillars having opposing first and second ends and a solder layer formed on the first end are provided, wherein the second ends of the metal pillars are disposed in the auxiliary dielectric layer and electrically connecting with the inner wiring, and the first ends of the metal pillars with the solder layer protrude from the first surface of the auxiliary dielectric layer, thereby achieving ultra-fine pitch and even-height conductive bumps.

US 2007/0124924 discloses a method of manufacturing a wiring substrate including the steps of obtaining a temporary substrate from a prepreg, and concurrently attaching a metal foil onto at least one surface of the temporary substrate, by disposing the metal foil on a prepreg through an underlying layer interposed between them, in a way that the underlying layer is disposed in a wiring formation region on the prepreg, and the metal foil having a size larger than that of the underlying layer is caused to contact with an outer peripheral portion of the wiring formation region, and then by hardening the prepreg with heating and pressurization, forming a build-up wiring layer on the metal foil, and obtaining a wiring member in which the build-up wiring layer is formed on the metal foil, by cutting out a portion of structure in which the underlying layer, the metal foil and the build-up wiring layer are formed on the temporary substrate, the portion corresponding to a peripheral portion of the underlying layer, and thus by separating the metal foil from the temporary substrate.

JP 2006 332115 relates to the problem to provide a process for producing a coreless wiring board in which the surface of a substrate can be roughened easily, and to provide a coreless wiring board thus produced in which fluidity of underfill material is improved. In a correspondingly disclosed process for producing a coreless wiring board, a multilayer sheet body (with multilayer wiring portion) is formed on a reinforcement substrate, and then the multilayer wiring portion is stripped from the reinforcement substrate thus facilitating production. Since an adhesion Cu foil having a surface roughened through roughening is employed, a first dielectric layer provided in tight contact therewith also has a major surface of sufficient roughness.

Although existing methods of manufacturing coreless component carriers are powerful, there is still room for improvement in terms of increasing the reliability of the manufactured component carriers. More specifically, conventionally manufactured component carriers may suffer from undesired delamination or decontamination of individual layers of the component carriers.

SUMMARY

There may be a need to enable the manufacture of reliable component carriers with reasonable manufacturing effort.

A semifinished product and a method of manufacturing component carriers according to the independent claims are provided.

According to an exemplary embodiment of the invention, a semifinished product is provided which comprises a sacrificial structure (or temporary carrier) and two component carriers releasably formed on opposing main surfaces of the sacrificial structure, wherein the sacrificial structure comprises a central structure and comprises releasing layers on or over both opposing main surfaces of the central structure, and wherein the central structure comprises a dummy core being covered (in particular fully, i.e. the entire main surfaces of the dummy core being covered) on or over both main surfaces thereof with a respective one of two spatially separated sections of separate material (in particular separate dielectric material).

According to another exemplary embodiment of the invention, a method of manufacturing a component carrier is provided which comprises releasably forming two component carriers on opposing main surfaces of a sacrificial structure, configuring the sacrificial structure to comprise a central structure and to comprise releasing layers on or over both opposing main surfaces of the central structure, and configuring the central structure to comprise a dummy core being covered (in particular fully) on or over both main surfaces thereof with a respective one of two spatially separated sections of separate material (in particular separate dielectric material).

In the context of the present application, the term "semifinished product" may particularly denote a physical structure which is not yet readily manufactured but requires further processing to obtain a final product which can functionally serve as stand-alone component carrier. In other words, a semifinished product may be a pre-form of a component carrier to be manufactured based on the semifinished product.

In the context of the present application, the term "sacrificial structure" may particularly denote a temporary carrier or an auxiliary structure which does not form part of the readily manufactured component carriers but is only used during their manufacturing process to hold two component carriers on two opposing main surfaces of the sacrificial structure to simplifying handling and improve mechanical robustness during manufacture. After having released the component carriers from the sacrificial structure, the sacrificial structure can be either used again for manufacturing further component carriers or may be disposed, i.e. sacrificed.

In the context of the present application, the term "component carrier" may particularly denote a physical structure which is configured for surface mounting and electrically contacting at least one electronic component, such as an encapsulated electronic chip. Thus, after such a surface mounting procedure, the component carrier carries the one or more electronic components. It is also possible that, additionally or alternatively, an electronic component is embedded in an interior of the respective component carrier.

According to an exemplary embodiment of the invention, the central structure comprises a dummy core being covered on or over both main surfaces thereof with one of two spatially spaced separated sections (preferably, but not necessarily of low-flow material, in particular low-flow prepreg, and preferably, but not necessarily, made of the same material). It has turned out that under certain processing conditions and under undesired circumstances, a sacrificial structure with a single material core between reinforcing layers or releasing layers on both main surfaces between the two component carriers may result, during lamination, in wrinkling and delamination of two electrically conductive layers (such as copper foils) opposing the respective releasing layer. When sandwiching an additional dummy core between two vertically spaced sections of the separate (separate in comparison to the material of the dummy core) material, the tendency of wrinkling and delamination of the two copper foils can be efficiently reduced. The mentioned dummy core prevents wrinkling of the copper foils by providing additional support and stability and prevents the copper foils from separating.

OVERVIEW OF EMBODIMENTS

In the following, further exemplary embodiments of the semifinished product and the method will be explained.

In an embodiment, the separated sections comprise a low-flow material. In the context of the present application, the term "low-flow material" (sometimes also denoted as "no-flow material") may particularly denote material which has no or only a very limited tendency to flow during processing under external pressure and elevated temperature, in particular during lamination. In particular, low-flow material may have a sufficiently high viscosity, for instance at least 5000 Poise, preferably at least 10000 Poise, at lamination temperature (for instance 150° C.). For example, when ordinary prepreg is heated under pressure, its resin melts (liquefies) and freely flows in any voids in the environment. There is a certain period of time during which the resin of ordinary prepreg remains fluidic enough to flow freely. In contrast to this, low-flow material as implemented in accordance with exemplary embodiments of the invention is specifically configured to suppress or even eliminate flow during lamination, so that the low-flow material substantially rests in place during lamination. According to the described exemplary embodiment of the invention, low flow material (in particular low-flow prepreg) can be implemented next to a core region of the sacrificial structure (wherein the low-flow material may be arranged between two copper foils, and may be accompanied by additional core material). With the use of such a low-flow sacrificial structure for the above-mentioned two spatially separated sections, it has surprisingly turned out that manufacture of the component carriers is possible without trimming after lamination. This overcomes a shortcoming of conventionally manufactured component carriers which may require trimming after lamination to prevent bubbles at the edge of the panel after the lamination. Inter alia, this distorts the further processing of the coreless component carriers, in particular a possible plating process. By providing the spatially separated sections of low-flow material, conventionally occurring bubbles at the edge of the panel after lamination that may conventionally cause chemical trap during a plating process may be advantageously prevented. Thus, manufacture of coreless component carriers can be significantly simplified when using a low-flow core of a sacrificial structure while guaranteeing a high reliability of the manufactured component carriers. When using conventional prepreg rather than low-flow material (such as low-flow prepreg), it may happen that the conventional prepreg flows out of the laminate during lamination causing burrs or the like. To remove such laterally outflowing conventional prepreg material, trimming or deburring is conventionally required prior to further processing the laminate. This may involve effort, reliability issues and problems with compatibility of the outflowing conventional prepreg material with chemicals used in the further manufacturing process. Such problems may be efficiently suppressed or even eliminated when using low-flow material in the sacrificial structure, in particular close to an interface between the sacrificial structure and the component carriers.

In an embodiment, the low-flow material comprises or consists of low-flow prepreg. Prepreg is a shorthand expression for "pre-impregnated". Prepreg may comprise fibers (such as glass fibers) in a matrix (for instance of resin, in particular epoxy resin). More specifically, prepreg may comprise fiberglass or other fabric reinforcement saturated with a polyimide, epoxy or other resin system, which has been partially cured (or reacted) during the coating operation. Low-flow prepregs are prepregs which are specifically modified to limit their flow. In context of the present application, the term "low-flow prepreg" may particularly denote prepreg engineered to have a controlled melt viscosity that results in very low flow during laminating structures of a component carrier such as a printed circuit board. Characterized by a high melt viscosity, low-flow prepregs do not flow excessively into voids but stay in place. Low-flow prepregs may be produced using epoxy systems modified with thermoplastic rubbers, or may be composed of partially crosslinked compounds. It is also possible that the low-flow characteristics are obtained by a specific chemical composition of the resin, which may include high molecular weight flow restrictors. For example, low-flow prepregs are available from the company Panasonic®, for instance as R1551 LF or R1551 WNL low-flow products, Arlon®, for instance as Arlon's 37N, 38N, 47N, 49N, 51N low-flow products, or from the company Ventec®, for instance as 104LF-75, 106LF-67, 106LF-72, 1080LF-64, 106LF-72, 1080LF-65, 106LF-72, 1080LF-65, 106LF-65, 106LF-68, or 1080 LF-62 low-flow products. Upon lamination (i.e. application of pressure at elevated temperature), low-flow prepreg may show fast cross-linking without or substantially without flowing into adjacent regions.

In an embodiment, the low-flow material has a flow range between 30 mil and 140 mil, in particular between 60 mil and 120 mil, more particularly between 60 mil and 90 mil. 1 mil corresponds to 0.001 inches or 25.40 μm. The so-called IPC Low-Flow test, to which the mentioned flow ranges relate, uses a sample in which two 1" diameter holes are punched and the amount of flow measured under test conditions as the amount of flow into the hole, measured as reduction in diameter of the hole. A corresponding specification is expressed in mils of hole diameter reduction, for instance 60 mils to 90 mils.

In an embodiment, the low-flow material has a viscosity between 5000 Poise and 100000 Poise, in particular between 5000 Poise and 50000 Poise, at 150° C. Particularly preferred is a corresponding range of values of the viscosity between 5000 Poise and 35000 Poise. 1 Poise is equivalent to $0.1$ Pa s=$0.1$ kg m$^{-1}$ s$^{-1}$. Thus, the viscosity values of low-flow prepreg are significantly higher than for conventional prepreg, corresponding to the significantly lower tendency to flow of low-flow prepreg as compared to conventional prepreg. For example, the low-flow material may have a minimum viscosity between 5000 Poise and 100000 Poise, at a temperature between 140° C. and 160° C.

In an embodiment, the low-flow material comprises a matrix of resin, fibers in the matrix, and high molecular weight additives in the matrix inhibiting flow. By selectively adding high molecular weight additives (for instance organic additives, polymers, etc.), the tendency to flow may be reduced in a precisely controllable manner.

In an embodiment, the low-flow material is partially cured and partially uncured. By adjusting the degree of being cured and uncured, the flow properties of the low-flow material may be accurately defined.

In an embodiment, the sacrificial structure comprises a central structure with the low-flow material and comprises releasing layers (in particular peel off layers) on or over both opposing main surfaces of the central structure, wherein each of the releasing layers is configured for enabling a release of the respective component carrier from the sacrificial structure (in particular by peeling off the respective component carrier from the sacrificial structure). Such a release layer may be a laminated film formed by laminating a thin fluorocarbon resin (PTFE) layer on a polyester or polyethylene terephthalate (PET) film, may be a polyester or PET film having a surface which is subjected to silicone, etc. The release layer may define the border between the sacrificial structure and the component carriers to be manufactured. Adhesion between the release layer and the adjacent material of the component carriers may be significantly lower than adhesion between the individual layer structures of the component carriers or the sacrificial structure, respectively.

In an embodiment, the dummy core comprises a central layer, in particular of prepreg (more particularly prepreg capable of flowing under pressure and heat rather than low-flow prepreg), and two electrically conductive layers, in particular of copper, on the central layer. This has turned out as a particularly efficient protection against wrinkling and delamination of the two copper foils.

In an embodiment, the dummy core is a Copper Clad Laminate (CCL). A process of creating a Copper Clad Laminate begins with glass cloth made from glass fiber. The glass cloth may be impregnated with a varnish made primarily from epoxy or other resins, and is then coated with a respective copper foil on both sides.

In an embodiment, the sacrificial structure further comprises reinforcing layers, in particular copper foils, each arranged between the central structure and a respective one of the releasing layers. Such reinforcing layers may have a relatively high thickness, for instance in the range between 10 μm and 30 μm, in particular between 15 μm and 25 μm, so as to provide a high mechanical stability during the lamination, handling and releasing procedures.

In an embodiment, at least one of the two component carriers is (in particular both component carriers are) configured as a coreless component carrier. Thus, such a component carrier may be a laminate of electrically conductive layer structures and electrically insulating layer structures but may be free of a core board. This allows to reduce thickness and improve compactness of the manufactured component carriers.

In an embodiment, the sacrificial structure has a thickness in a range between 10 μm and 300 μm. In an embodiment, the separate sections may have, alone or together, a thickness in a range between 40 μm and 260 μm.

In an embodiment, the two component carriers are formed with a symmetric constitution. Thus, the electrically conductive and the electrically insulating layer structures may be attached to and processed at opposing main surfaces of the component carriers and connected thereto by lamination, to provide for a very symmetric structure. Such a symmetric (in particular mirror symmetric) architecture of component carriers and preferably also sacrificial structure prevents warpage and mechanical stress.

In an embodiment, each of the component carriers comprises, at a respective interface to the sacrificial structure, an ultra-thin electrically conductive layer, in particular a copper layer having a thickness of less than 5 μm, more particularly of less than 3 μm. For example, the thickness of the mentioned copper layers may be between 2 μm and 3 μm. Hence, with the described manufacturing procedure, it is possible to use significantly thinner copper layers than conventionally implemented. Since the mentioned copper layers can be further processed (in particular patterned, etc.) after releasing the component carriers from the sacrificial structure to form electrically conductive traces or the like, a small thickness is of particular advantage (in particular in terms of the more straight shape of the edges of such traces manufactured based on (in particular by patterning) the ultra-thin electrically conductive layers).

In an embodiment, each of the component carriers comprises at least one electrically insulating layer structure and/or at least one electrically conductive layer structure. Such layer structures may be complete layers, patterned layers, multiple islands within a common plane, etc.

In an embodiment, the two electrically insulating layer structures located closest to the sacrificial structure (i.e. one electrically insulating layer structure on a respective main surface of each of the component carriers) are pure electrically insulating layers without electrically conductive material therein. This advantageously prevents stress within the semifinished product during lamination, since this layer has homogenous material properties matching to homogenous properties of layers of the sacrificial structure. Moreover, forming the electrically insulating layer structures located closest to the sacrificial structure as pure electrically insulating layers (in particular non-processed prepreg layers), it is possible to process (in particular by forming electrically conductive structures such as vias within the respective electrically insulating layer) these layers after releasing the respective component carrier from the sacrificial structure at the respective releasing layer. This procedure has turned out as very efficient in terms of suppressing warpage.

In an embodiment, the pure electrically insulating layers are prepreg layers. They may be normal prepreg layers rather than low-flow prepreg layers thereby allowing to contribute to the connection between the constituents of the component carriers by melting and cross-linking during lamination.

In an embodiment, the two electrically insulating layer structures (each of which relating to a respective one of the component carriers) located closest to the sacrificial structure on the one hand and the separated sections (in particular made of low-flow material) on the other hand are made of materials having substantially the same coefficients of thermal expansion (CTE values). Preferably, a respective very thin three layer stack may be sandwiched between a respective one of the electrically insulating layer structures located closest to the sacrificial structure on the one hand and separated sections of the sacrificial structure on the other hand. For example, the releasing layer may have a first copper foil of a thickness between 2 µm and 3 µm (as an example for the ultra-thin electrically conductive layer) on one main surface and a second copper foil with a thickness of 18 µm (as an example for the reinforcement layer) on the opposing main surface. Such a very thin three layer stack may show the tendency of undesired delamination or wrinkling. In particular, the ultra-thin electrically conductive layer and the reinforcement layer may tend to delaminate and wrinkle in particular at an edge of the panel or layer stack forming the semifinished product, which may result in reliability issues. It has turned out that a CTE adjustment of the dielectric layers above and below the thin three layer stack may advantageously suppress or eliminate delamination and wrinkling. Without wishing to be bound to a specific theory, it is presently believed that, when selecting the materials of the dielectric layers above and below the thin three layer stack from a substantially or exactly the same value of the coefficient of thermal expansion (for instance with a deviation of the CTE values of less than 20%, in particular less than 10%), forces acting on the thin three layer stack during the lamination under elevated pressure and elevated temperature are reduced or balanced out. Accordingly, the thin three layer stack may be prevented from suffering from unbalanced forces from above and below resulting from a different thermal expansion of the respective material above and below the thin three layer stack.

In an embodiment, the at least one electrically insulating layer structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg (in particular B-stage prepreg) or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In an embodiment, each of the component carriers comprises an odd number of electrically insulating layer structures. This becomes possible according to an exemplary embodiment of the invention, since the two component carriers may be formed coreless on both opposing main surfaces of the sacrificial structure, so that there is no need to symmetrically apply two new layers on opposing two sides of one of the component carriers in each cycle. The symmetry is advantageously maintained only with regard to the two component carriers relative to one another and with regard to the internal composition of the sacrificial structure, not with regard to the internal composition of a respective one of the component carriers.

In an embodiment, at least part of the sacrificial structure, in particular only the dummy core, is provided with at least one, in particular with a plurality of, alignment markers, in particular alignment through holes. For instance, the alignment markers may be through holes formed by mechanical drilling through the sacrificial structure or part thereof (preferably exclusively through the dummy core). For instance, it may be sufficient to form the through holes exclusively in a Copper Clad Laminate forming a central structure of the sacrificial structure. For instance, such alignment markers may be formed in four corner regions of a substantially rectangular semifinished product or panel. They may help for adjusting a spatial relationship between the semifinished product or part thereof an manufacturing equipment.

In an embodiment, an electronic component may be surface mounted on and/or embedded in at least one of the component carriers. Such a surface mounted or an embedded electronic component may be selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, also other electronic components may be surface mounted on or embedded in the electronic device.

In an embodiment, the component carriers are configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the method comprises providing two layer structures, each comprising, in a center thereof, a respective one of the releasing layers, in particular a peel off layer, covered on one main surface with a reinforcing layer, in particular a copper foil, and on an opposing other main surface with an ultra-thin electrically conductive layer, in particular a copper layer having a thickness of less than 5 µm, more particularly of less than 3 µm. The method may further comprise connecting the central structure so as to have the separated sections between the two reinforcing layers. Consequently, the central structure, the reinforcing layers and the releasing layers form part of the sacrificial structure. Correspondingly, the ultra-thin electrically conductive layers form part of the two component carriers. For example, the releasing layer may have a first copper foil of a thickness between 2 µm and 3 µm (as an example for the ultra-thin electrically conductive layer) on one main surface and a second copper foil with a thickness of 18 µm (as an example for the reinforcement layout) on the opposing main surface. Such a very thin three layer stack, when taken alone, may be difficult in handling and is therefore supported on low-flow prepreg (which is highly preferably, in turn, attached to a further central structure of the sacrificial structure). By taking this measure, undesired delamination or wrinkling of the thin three layer stack may be efficiently prevented. In particular the ultra-thin electrically conductive layer and the reinforcement layer may tend to delaminate and wrinkle in particular at an edge of the panel or layer stack forming the finished product, which may result in reliability issues. When attaching the thin three layer stack on the central structure of the sacrificial structure, such delamination and wrinkling may be strongly suppressed which is of high advantage.

In an embodiment, the method comprises releasing the two component carriers from the sacrificial structure. This may be accomplished by pulling on the respective component carrier, thereby simply detaching the respective component carrier from the respective release layer.

In an embodiment, the method comprises mounting at least one electronic component on at least one of the released two component carriers. The direct result of such a manufacturing process is an electronic device composed of the manufactured component carrier with the at least one electronic component mounted thereon (for instance connected and electrically contacted to at least one electrically conductive layer structure of the component carrier by soldering).

In an embodiment, the component carriers are formed on the sacrificial structure by laminating. Laminating may be accomplished by applying pressure onto the semifinished product while simultaneously applying thermal energy.

In an embodiment, the method comprises forming at least one electrically conductive contact structure, in particular at least one vertical interconnect, in at least one of the component carriers after having completed the laminating, in particular after having released the component carriers from the sacrificial structure. In particular vias may be manufactured after separation of the component carriers from the sacrificial structure, which vias may extend through an electrically insulating layer structure of the released component carriers after the releasing procedure. It has turned out that this processing order significantly reduces warpage of the readily manufactured component carriers.

In an embodiment, the method comprises forming at least one electrically conductive contact structure by carrying out a semi additive process (SAP) or a modified semi additive process (mSAP). According to an mSAP process, an unpatterned board has a thin layer of electrically conductive material (such as copper) already on it. A reverse mask is then applied. Unlike a subtractive process mask, this mask exposes those parts of the substrate that shall become the traces. Additional electrically conductive material (such as copper) is then plated onto the board. In the unmasked areas conductive material (such as copper) may be plated to any desired weight. Tin-lead or other surface platings are then applied. The mask is stripped away and an etching procedure removes the now exposed bare original copper laminate from the board, isolating the individual traces.

In another embodiment, the method comprises forming at least one electrically conductive contact structure by a subtractive process. Subtractive methods may remove electrically conductive material such as copper from a board entirely coated with electrically conductive material to leave only the desired pattern of electrically conductive material (such as electrically conductive traces).

In an embodiment, the method comprises forming at least one electrically conductive contact structure in a pure or unprocessed electrically insulating layer structure of at least one of the component carriers, which electrically insulating layer structure is located closest to the sacrificial structure prior to releasing, after having released the at least one of the component carriers from the sacrificial structure. When the dielectric layer structure positioned next or closest to the sacrificial structure is configured as a homogeneous structure made of the electrically insulating material only, and not including electrically conductive inclusions or structures, a lamination procedure does not involve warpage, since the low-flow material and the homogeneous dielectric layer keep the mechanical stress low and well distributed. Thus, component carriers with low or no tendency of warpage may be obtained. After having released the component carriers from the sacrificial structure, the mentioned homogeneous closest electrically insulating layer structure is located very close to the surface of the respective component carrier (in particular separated from the surface only by the ultra-thin electrically conductive layer). After a corresponding releasing procedure, it is possible to produce conductive structures (such as vias) within this homogeneous purely dielectric electrically insulating layer.

In one embodiment, the method comprises forming all electrically insulating layer structures of the component carriers prior to releasing the component carriers from the sacrificial structure. In an alternative other embodiment, the method comprises forming a first part of electrically insulating layer structures of the component carriers prior to releasing the component carriers from the sacrificial structure, and forming a second part of electrically insulating layer structures of the component carriers after releasing the component carriers from the sacrificial structure. Thus, the manufacturing architecture according to exemplary embodiment of the invention is very flexible.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 2 shows a cross-sectional view of a semifinished product according to an exemplary embodiment of the invention.

FIG. 3 shows a cross-sectional view of a semifinished product according to another exemplary embodiment of the invention.

DETAILED DESCRIPTION OF EXEMPLARY EMBODIMENTS

Figure 1:
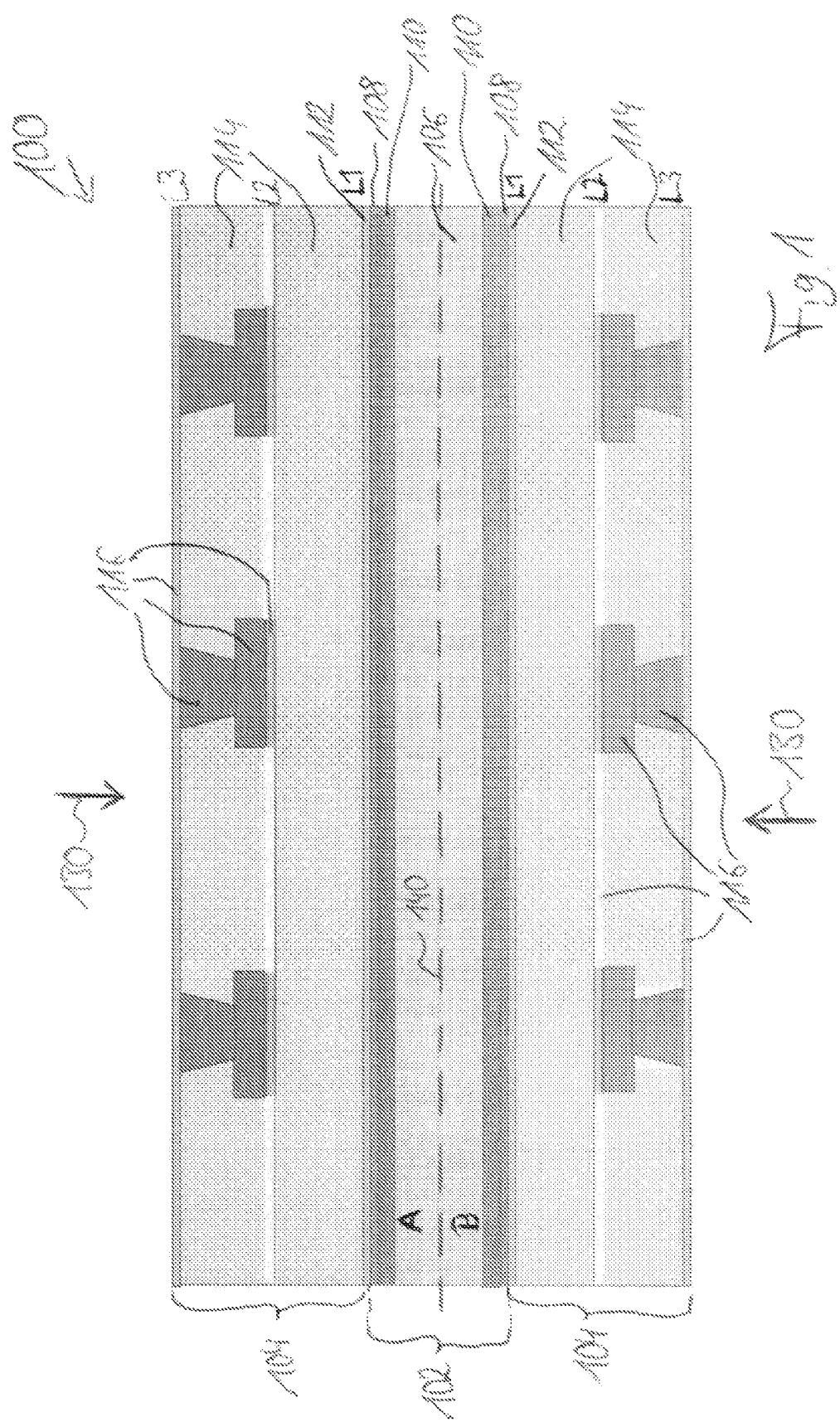
FIG. 1 shows a cross-sectional view of a semifinished product developed by the applicant of the present patent application but not falling under the claims.

The illustrations in the drawings are presented schematically.

Before, referring to the drawing, exemplary embodiments will be described in further detail, some basic considerations will be summarized based on which exemplary embodiments of the invention have been developed.

According to an exemplary embodiment of the invention, a coreless manufacturing procedure is provided which implements in a sacrificial structure a central dummy core with two opposing main surfaces on which further layers of the sacrificial structure are formed symmetrically on both sides. More specifically, two sections (preferably made of prepreg material) are attached onto the main surfaces of the dummy core, followed by a reinforcing layer, a releasing layer and an ultra-thin electrically conductive layer (the latter already forming part of the component carrier to be manufactured). It has turned out that the stabilizing dummy core in combination with the two spatially separated sections of separate material (wherein the material of the different sections is preferably identical) can efficiently prevent undesired wrinkling, delamination or contamination of the reinforcing layer and/or the ultra-thin electrically conductive layer. Thus, the described composition of the sacrificial structure with the centralized dummy core and the two externally attached sections of separate material improves reliability of the manufactured component carriers.

According to another exemplary embodiment of the invention which can however be advantageously combined with the previously described embodiment, a coreless manufacturing procedure is provided which implements low flow prepreg as material of a sacrificial structure for producing a substrate such as a printed circuit board (PCB). More particularly, an exemplary embodiment of the invention adapts coreless manufacturing technology with low flow prepreg used for a carrier or sacrificial structure implemented on a substrate like a PCB which thin core thickness, for instance in a range between 0.025 mm and 0.050 mm. A corresponding manufacturing architecture can be applied for a subtractive process as well as for mSAP (modified semi-additive process) for fine line PCB structuring.

A conventional manufacturing procedure for high density integration (HDI) component carriers starts from core layer laser drill, metallization and patterning. However, if the core thickness becomes too thin (for instance less than 50 µm), wet process equipment may have difficulty in transportation or handling of the thin core during processing. For instance in the case of mSAP processing, a core layer with a copper foil having a thickness of 2 µm to 3 µm is too thin and may involve a risk in terms of a laser drill through issues on back side copper.

In contrast to this, an exemplary embodiment of the invention implementing coreless technology with a carrier having a thickness of 100 µm or more can overcome the mentioned thin panel transportation problem during dry and wet process. Laser drill, metallization and lithography may be built on from both opposing sides or main surfaces of a carrier or sacrificial structure starting from outer laminated layers after completion of a DIP layer (drilled inner layer). It is possible to layup and press it for an EP (external plane) layer (i.e. an outer layer), then remove the carrier or sacrificial structure by peeling off. Afterwards, it is possible to continue build-up of the external plane layer in accordance with a high integration density (HDI) equipment and processing.

Highly advantageously, a method of manufacturing component carriers according to an exemplary embodiment of the invention may use low flow prepreg between two metal foils (such as copper foils), wherein the low-flow prepreg itself is preferably split into two separate sections sandwiching a dummy core, so that there is no need to carry out trimming after lamination. This highly advantageously prevents bubbles at the edge of the panel or semifinished product after lamination that can conventionally cause chemical trap during a plating process.

According to yet another exemplary embodiment of the invention, a coreless manufacturing procedure is provided which implements unprocessed or pure (i.e. free of vias or the like) electrically insulating layers as closest dielectric material to a sacrificial structure on both sides of a semi-finished product having the sacrificial structure sandwiched between two component carriers to be manufactured. When outermost pure dielectric layers of the sacrificial structure are combined therewith, it can be guaranteed that lamination during manufacture does not result in warpage in the manufactured component carriers. Processing (such as via formation, patterning of metallic material thereon, etc.) of the dielectric layers of the component carriers closest to the sacrificial structure can be carried out after releasing or delaminating the respective component carrier from the sacrificial structure. By preventing warpage and bending of the component carriers triggered by lamination, flat planar component carriers can be obtained. This advantage can be obtained particularly pronounced when the CTE values (within the plane of the layers and/or along a stacking direction orthogonal thereto) of the outermost dielectric layer(s) of the sacrificial structures and the innermost dielectric layers of the component carriers are substantially identical (in particular vary by less than 10% or less than 20%).

Inter alia, one or more of the following implementations may be done in terms of embodiments of the invention:

1. Alignment mark design for layer L2 (see FIG. 1) with carrier bevelling
2. Tooling preparation and generation of pattern artwork and laser drill program according to the described buildup design
3. Peel-off process for carrier removal
4. Impedance and dielectric thickness adjustment In particular, an exemplary embodiment of the invention has the advantage to improve and overcome thin core transportation and handling scarp issue of conventional HDI equipment for both imaging and metallization process. Moreover, exemplary embodiments of the invention advantageously prevent rejection of laser drill through issues on thin copper foils of back side during an mSAP core process.

Exemplary embodiments of the invention may be flexibly applied to the manufacture of HDI boards with any desired number of layers, substrates, printed circuit boards, etc. In terms of the involved processing, exemplary embodiments of the invention are compatible with subtractive processing, modified semi additive processing (mSAP) and semi additive processing (SAP).

Coreless technology according to an exemplary embodiment of the invention may be to applied advantageously to thin cores with a thickness of less than 50 µm and mSAP technology on fine line structuring (in particular for L/S from 15 µm to 25 µm).

FIG. 1 shows a cross-sectional view of a semifinished product 100 developed by the applicant of the present patent application but not falling under the claims of the present patent application. FIG. 1, which does not form part of the prior art for the exemplary embodiments of the invention of FIG. 2 and FIG. 3, is described for comparison purposes to render advantageous technical effects of certain features of the embodiments of FIG. 2 and FIG. 3 better understandable.

The semifinished product 100 comprises a central sacrificial structure 102 having, in turn, a central structure 106 made of low-flow prepreg material. For instance, the low-flow prepreg material has a flow range of 80 mil and has a viscosity of 30000 Poise at 150° C. The low-flow material comprises a matrix of epoxy resin, glass fibers in this matrix, and high molecular weight additives in the matrix which are specifically selected for inhibiting flow during lamination conditions. Consequently, the low-flow material has only a very limited tendency to flow during the lamination of the various layer structures of the semifinished product 100 shown in FIG. 1 by applying pressure and increasing the temperature. Correspondingly, the flow range value may be smaller and the viscosity value may be larger than corresponding values of materials used for conventionally implemented sacrificial structures.

In addition to the central structure 106, the sacrificial structure 102 comprises two carrier or reinforcing layers 110, which may be embodied as copper foils and which may for example have a relatively large thickness of 18 μm. Each reinforcing layer 110 may be attached to a corresponding main surface A, B of the central structure 106. More precisely, each of the reinforcing layers 110 may be arranged between the central structure 106 and a respective one of two releasing layers 108. The two releasing layers 108 are hence applied on both opposing exposed main surfaces of the reinforcing layers 110 which cover, in turn, the main surfaces A, B of the central structure 106. Each of the releasing layers 108 is configured for enabling a release of a respective one of two component carriers 104 of the semifinished product 100 from the sacrificial structure 102. Releasing may be accomplished by simply peeling off the respective component carrier 104 from the sacrificial structure 102. Thus, the two component carriers 104 are releasably formed on opposing main surfaces of the sacrificial structure 102. For example, the sacrificial structure 102 may have an overall thickness of 50 μm.

The semifinished product 100 furthermore comprises the two components carriers 104, which may also be pre-forms of readily manufactured component carriers (i.e. the shown component carriers 104 may be made subject to further processing, in particular after release, if desired). The component carriers 104 are configured as coreless component carriers 104, i.e. do not comprise a core on their own which allows to manufacture them in a compact way. As can be taken from FIG. 1, the two component carriers 104 are formed with a mirror symmetric constitution, compare symmetry plane 140. This symmetric configuration with regard to the sacrificial structure 102 reduces mechanical and thermal stress during the manufacturing procedure. Advantageously, each of the component carriers 104 comprises, at a respective interface to the sacrificial structure 102, an ultra-thin electrically conductive layer 112 which may be embodied as a copper foil and which may have a thickness in a range between 2 μm and 3 μm. After release of the component carrier 104 from the sacrificial structure 102, the ultra-thin electrically conductive layers 112 may be patterned (for instance in an mSAP process) for forming electrically conductive traces. In view of their very small thickness, quality and reliability of the patterned electrically conductive layers 112 is extremely good. The opportunity to select a very thin thickness of the electrically conductive layers 112 is also a consequence of manufacturing the central structure 106 from a low-flow prepreg material.

Starting on both opposing main surfaces of the sacrificial structure 102, a plurality of symmetric stacked layers L1, L2, L3 are constituted to form part of the respective component carrier 104. The respective layers L1, L2, L3 (three are shown in FIG. 1 on each main surface of the sacrificial structure 102, but any larger or smaller number is possible as well) may be attached sequentially on the exposed surfaces of the component carriers 104 to be manufactured, and may be connected to the existing stack by lamination. Each of the layers L1, L2, L3 of the component carriers 104 may comprise at least one electrically insulating layer structure 114 and/or at least one electrically conductive layer structure 116. The electrically conductive layer structures 106 may be made of copper. The electrically insulating layer structures 106 may be made of prepreg/FR4. The component carriers 104 may be configured as a printed circuit board or as a substrate.

In order to obtain the semifinished product 100 shown in FIG. 1 and to thereby manufacture the component carriers 104, the sacrificial structure 102 comprising the low-flow prepreg material is formed. On the basis of the central structure 106 of the low-flow prepreg material, the reinforcing layers 110 are attached to the two opposing main surfaces A and B, followed by attaching the release layers 108 onto the exposed surfaces of the reinforcing layers 110. Then or later, the mentioned constituents are interconnected to one another by lamination, i.e. application of high pressure and high temperature.

Subsequently, the respective layers L1, L2, L3 of the two component carriers 104 are formed (interconnected to one another but releasable as a whole) on opposing main surfaces of the sacrificial structure 102 by one or more lamination procedures. This can be accomplished by placing prepreg layers (see electrically insulating layer structures 114) and copper layers (see the planar structures of the electrically conductive layer structures 116, for instance having a thickness in a range between 2 μm and 3 μm) on top of one another and interconnecting them by laminating. Since the electrically insulating layer structures 114 may be made of regular prepreg rather than from low-flow prepreg, they are melted and become flowable during the lamination procedure. After being solidified, the various layer structures 114, 116 are consequently interconnected.

As can be taken from FIG. 1, it is further possible to form copper vias (see the vertical interconnect structures of the electrically conductive layer structures 116) in the outermost layers L3 of the component carriers 104. As schematically indicated by arrows 130, further layers may be processed in accordance with a modified semi additive process (mSAP).

After having obtained the semifinished product 100 shown in FIG. 1 but not shown in the figure, the method may further comprise releasing the two component carriers 104 from the sacrificial structure 102 by peeling them off at the release layers 108.

Advantageously, the method may subsequently comprise the procedure of forming further electrically conductive contact structures (in a similar way as shown with reference numeral 116), in particular comprising horizontal traces and/or vertical interconnects, in the then exposed surface portions (i.e. in particular relating to layers L1) of the singularized or separated component carriers 104 after having completed the lamination and the release. Advantageously, the tendency of the manufactured component carriers 104 to bend or be subject to a warpage can be significantly reduced by forming in particular vias only after the release.

Although not shown in the figure, it is subsequently possible to surface mount one or more electronic components on the readily manufactured singularized two component carriers 104, for instance by soldering to provide a connection between contacts of the electronic component and exposed portions of electrically conductive layer structure 116.

As can be taken from FIG. 1, it is possible that each of the component carriers 104 comprises an odd number of electrically insulating layer structures 114. This increases the freedom of design as compared to conventional core-type component carriers which results from the symmetric arrangement of the two component carriers 104 on both opposing main surfaces of the sacrificial structure 102 due to the coreless design.

One exemplary process workflow for manufacturing component carriers 104 is the following:

1. Preparation of the carrier or sacrificial structure 102:
   Provide the central structure 106 of low-flow prepreg
   Attach the reinforcing layers 110 (for instance copper foils having a thickness of 18 µm) onto the central structure 106 and the releasing layers 108 onto the reinforcing layers 110
   Attach the ultra-thin electrically conductive layers 112 (for instance copper foils having a thickness between 2 µm and 3 µm) onto the sacrificial structure 102
2. Carry out an mSAP process with the sacrificial structure 102 or carrier (adjacent main surfaces A, B)
   Start to build Layers L2 by mSAP on the carrier
   Continue with one or more DIP layers L3, L4, L5, . . . (not shown) on layer L2
   Separate component carriers 104 (such as PCBs) from carrier or sacrificial structure 102 once finished with the mSAP DIP build
3. Completion of EP (external plane) layer
   mSAP for EP layer of laser/via fill/Cu/pattern process
   Proceed with conventional processing (such as SM/MF and other processes for EP layer)

Laser drill, metallization and lithography may be built on from main surfaces A and B side adjacent to the carrier starting from layers L2, L3, . . . after completion of DIP layer. It is possible to layup and press it for EP layer, then remove the carrier by peeling off. Afterwards, it is possible to process with an EP build using HDI equipment and process.

FIG. 2 shows a cross-sectional view of a semifinished product 100 according to an exemplary embodiment of the invention. This embodiment relates to a coreless technology on a full layer build. Many of the features of the semifinished product 100 according to FIG. 2 correspond to corresponding features of the semifinished product 100 according to FIG. 1. Hence, explicit reference is made concerning the disclosure of such features referring to the description of FIG. 1 also for the semifinished product 100 according to an exemplary embodiment of the invention according to FIG. 2.

The semifinished product 100 according to FIG. 2 differs from the semifinished product 100 according to FIG. 1 in particular concerning the composition of the sacrificial structure 102. According to FIG. 2, the sacrificial structure 102 comprises a central structure 106 with two spatially separated sections 220, 222 of low-flow material externally covered by a respective one of the reinforcing layers 110. As in FIG. 1, also the semifinished product 100 according to FIG. 2 comprises two releasing layers 108 (at which the component carriers 104 can be peeled off from the sacrificial structure 102) each on a respective one of the reinforcing layers 110 and over a respective one of opposing main surfaces of the central structure 106. In contrast to FIG. 1, the sacrificial structure 102 according to FIG. 2 has a composition of the central structure 106 which comprises a dummy core 200 being covered on both main surfaces thereof with a respective one of two separate sections 220, 222 of the low-flow prepreg. The dummy core 200, in turn, comprises a central layer 202 of (for instance normal flow) prepreg and two electrically conductive layers 204, 206, which are here embodied as copper foils, on the central layer 204. Hence, the dummy core 200 may be embodied as a Copper Clad Laminate (CCL).

This composition of the sacrificial structure 102 has significant technical advantages, so that embodiment of FIG. 2 is further improved over the semifinished product 100 according to FIG. 1: Firstly, the provision of two distinct sections 220, 222 of low-flow prepreg has the advantage that no bubbles occur at the edge of the laminate which conventionally result from prepreg resin flowing laterally out of the layer stack. Trimming or any other further processing of the edge region after lamination therefore becomes dispensable when using low-flow prepreg for sections 220, 222. Secondly, the additional provision of the dummy core 200 provides additional stability and highly advantageously prevents delamination or wrinkling of the copper foils (see reference numerals 110, 112) covering the both opposing main surfaces of the releasing layers 108. This improves the reliability and quality of the manufactured component carriers 104. Furthermore, any decontamination of the ultra-thin electrically conductive layers 112 can be avoided by taking this measure.

As in FIG. 1, the two symmetrically positioned electrically insulating layer structures 114 located closest to the sacrificial structure 102 are unprocessed and pure electrically insulating layers, here embodied as pure prepreg layers, without electrically conductive material therein. The electrically insulating layer structures 114 located closest to the sacrificial structure 102 and the low prepreg are made of materials having the same coefficient of thermal expansion (CTE). These two measures, more precisely each alone and even more both in combination, have the significant advantage that heating during the lamination does not result in significantly different thermal expansion on both opposing main surfaces of the three-layer stacks or layer structures 210. Consequently, the manufactured component carriers 104 do not suffer from warpage or bending. Although not shown in the figures, the electrically insulating layer structures 114 located closest to the sacrificial structure 102 will be positioned very close to the surface of the corresponding component carrier 104 after releasing the component carrier 104 from the sacrificial structure 102, only separated therefrom by the ultra-thin electrically conductive layer 112. Thus, electrically conductive structures such as vertical interconnects (in particular vias) may be formed in the electrically insulating layer structures 114 located closest to the sacrificial structure 102 after releasing. The electrically insulating layer structures 114 located closest to the sacrificial structure 102 may then also be patterned so as to form electrically conductive traces.

It can furthermore be taken from FIG. 2 that the dummy core 200 is provided with a plurality of alignment markers 208, here embodied as alignment through holes, which simplifies alignment of the semifinished product 100 during manufacture. The alignment markers 208 may be embodied as a frame drill and may be arranged in four corners of a rectangular dummy core 200.

When manufacturing the semifinished product 100, a corresponding method may start with the provision of two layer structures 210, each comprising a central releasing layer 108 covered on one main surface with a reinforcing layer 110 and on an opposing other main surface with an ultra-thin electrically conductive layer 112. To improve handling, the layer structures 210 are then connected with the core of the sacrificial structure 102. The central structure 106, the reinforcing layers 110 and the releasing layers 108 form part of the sacrificial structure 102 in the following. In contrast to this, the ultra-thin electrically conductive layers 112 form part of the two component carriers 104 in the following.

Starting from the semifinished product 100 shown in FIG. 2, a further build-up of one or more other layers on the exterior surfaces 220, 222 can be accomplished. With the shown coreless technology, a full layer build up is possible, before separating the component carriers 104 from the carrier or sacrificial structure 102.

FIG. 3 shows a cross-sectional view of a semifinished product 100 according to another exemplary embodiment of the invention. This embodiment relates to a coreless technology on 4 layer build. Apart from this, the architecture according to FIG. 3 corresponds to that of FIG. 2.

Starting from the semifinished product 100 shown in FIG. 3, a further build-up DIP may be carried out on 1B side layers. Thus, a coreless only on core and DIP 1 layer technology is possible, before separating the component carriers 104 from the carrier or sacrificial structure 102. In this context, the terms "IP" and "DIP" mean a normal high integration method core layer and 1xxx layer.

In the following, a process in accordance with the coreless technologies of FIG. 2 and FIG. 3 will be explained.

Firstly, a carrier preparation is carried out to prepare the sacrificial structure 102:

A dummy core 200 or panel with a thickness of about 100 μm is prepared, wherein a panel size may be the same as a PCB panel size.

Then, frame drilling on dummy core 200 is carried out to produce the alignment markers 208.

Subsequently, layers 220, 222, 110, 108, 112 up the prepreg layers (see reference numerals 114) on the dummy core 200 are built up, and the carrier layer or sacrificial structure 102 is pressed together with the first PCB layer, as shown.

Secondly, a coreless method is carried out for 4 layer (see FIG. 3) or full layer (see FIG. 2) build up:

In case of a modified semi additive process (mSAP), the procedure continues to laser drill, electroless deposition, dry film application, photo pattern, plating.

In case of a high density integration process, the procedure continues to black oxide processing, laser drill, electroless deposition, via formation and photo processing.

It is possible to apply the coreless method for 4 layer (see FIG. 3) or full layer (see FIG. 2) build depending on design and process capability.

Thirdly, it is possible to separate the component carrier 104 (PCBs or preferably substrates) from the carrier layer or sacrificial structure 102:

For example, the component carrier 104 are manually separated from the releasing layers 108 of the carrier or sacrificial structure 102.

The carrier or sacrificial structure 102 may be disposed for other usage.

Layer formation for the component carriers 104 may be continued with a high density integration or mSAP process.

In the embodiment according to FIG. 2, all electrically insulating layer structures 114 can be applied on the semifinished product 100 before releasing the component carriers 104 from the sacrificial structure 102. In the embodiment according to FIG. 3, only a part of the electrically insulating layer structures 114 can be applied on the semifinished product 100 before releasing the component carriers 104 from the sacrificial structure 102, and another part of electrically insulating layer structures 114 can be applied on the semifinished product 100 after releasing the component carriers 104 from the sacrificial structure 102.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A semifinished product, comprising:
   a sacrificial structure;
   two component carriers releasably formed on opposing main surfaces of the sacrificial structure;
   wherein the sacrificial structure comprises a central structure and releasing layers on or over both opposing main surfaces of the central structure;
   wherein the central structure comprises a dummy core being covered on or over both main surfaces thereof with a respective one of two spatially separated sections of separate dielectric material;
   wherein the dummy core comprises a central layer and two electrically conductive layers on the central layer.

2. The semifinished product according to claim 1, wherein the separated sections comprise a low-flow material.

3. The semifinished product according to claim 2, wherein the low-flow material comprises or consists of low-flow prepreg.

4. The semifinished product according to claim 2, comprising at least one of the following features:
   the low-flow material has a flow range between 30 mil and 140 mil;
   the low-flow material has a viscosity between 5000 Poise and 100000 Poise at 150° C.;
   the low-flow material has a minimum viscosity between 5000 Poise and 100000 Poise, at a temperature between 140° C. and 160° C.;
   the low-flow material comprises or consists of a matrix of resin, fibers in the matrix, and additives in the matrix inhibiting flow.

5. The semifinished product according to claim 1, wherein each of the releasing layers is configured for enabling a release of the respective component carrier from the sacrificial structure by peeling off the respective component carrier from the sacrificial structure.

6. The semifinished product according to claim 1, wherein the dummy core comprises a central layer of prepreg, and wherein the two electrically conductive layers are copper.

7. The semifinished product according to claim 1, wherein the dummy core is a Copper Clad Laminate (CCL).

8. The semifinished product according to claim 1, comprising at least one of the following features:

the sacrificial structure further comprises reinforcing layers each arranged between the central structure and a respective one of the releasing layers;

at least one of the two component carriers is configured as a coreless component carrier;

the low-flow material has a thickness in a range between 40 μm and 260 μm.

9. The semifinished product according to claim 1, wherein the two component carriers in combination with the sacrificial structure, are formed with a symmetric constitution.

10. The semifinished product according to claim 1, wherein each of the component carriers comprises, at a respective interface to the sacrificial structure, an ultra-thin electrically conductive layer having a thickness of less than 5 μm.

11. The semifinished product according to claim 1, wherein each of the component carriers comprises at least one electrically insulating layer structure, and at least one electrically conductive layer structure, the at least one electrically insulating layer structure relating to a component carrier located closest to the sacrificial structure being an unprocessed electrically insulating layer of prepreg.

12. The semifinished product according to claim 11, comprising at least one of the following features:

the two electrically insulating layer structures, each of which relating to a respective one of the component carriers, located closest to the sacrificial structure and the separated sections are made of materials having substantially the same coefficients of thermal expansion;

the at least one electrically insulating layer structure comprises at least one of the group consisting of resin, cyanate ester, glass, glass fibers, prepreg material, polyimide, liquid crystal polymer, epoxy-based Build-Up Film, FR4 material, a ceramic, and a metal oxide;

the at least one electrically conductive layer structure comprises at least one of the group consisting of copper, aluminum, and nickel;

each of the component carriers comprises an odd number of electrically insulating layer structures.

13. The semifinished product according to claim 1, wherein the dummy core is provided with at least one alignment marker.

14. The semifinished product according to claim 1, wherein the component carriers are configured as one of the group consisting of a printed circuit board, and a substrate.

15. A method of manufacturing component carriers, the method comprising:

releasably forming two component carriers on opposing main surfaces of a sacrificial structure;

configuring the sacrificial structure to comprise a central structure and to comprise releasing layers on or over both opposing main surfaces of the central structure;

configuring the central structure to comprise a dummy core being covered on or over both main surfaces thereof with a respective one of two spatially separated sections of separate dielectric material;

wherein the dummy core comprises a central layer and two electrically conductive layers on the central layer.

16. The method according to claim 15, wherein the method comprises:

providing two layer structures, each comprising, in a center thereof, a respective one of the releasing layers covered on one main surface with a reinforcing layer and on an opposing other main surface with an electrically conductive layer having a thickness of less than 5 μm;

connecting the central structure having the separated sections between the two reinforcing layers;

wherein the central structure, the reinforcing layers and the releasing layers form part of the sacrificial structure; and wherein the electrically conductive layers form part of the two component carriers.

17. The method according to claim 15, wherein the method comprises releasing the two component carriers from the sacrificial structure, and mounting at least one electronic component on and/or embedding at least one electronic component in at least one of the two released component carriers.

18. The method according to claim 15, wherein at least part of the component carriers is formed on the sacrificial structure by laminating, forming at least one electrically conductive contact structure on and/or in at least one of the component carriers after having completed the laminating after having released the component carriers from the sacrificial structure, and forming at least one electrically conductive contact structure in an electrically insulating layer structure of at least one of the component carriers, which electrically insulating layer structure is located closest to the sacrificial structure prior to releasing, after having released the at least one of the component carriers from the sacrificial structure.

19. The method according to claim 15, wherein the method comprises at least one of the following features:

forming at least one electrically conductive contact structure by carrying out a semi additive process or a modified semi additive process;

forming all electrically insulating layer structures of the component carriers prior to releasing the component carriers from the sacrificial structure.

20. The method according to claim 15, wherein the method comprises forming a first part of electrically insulating layer structures of the component carriers prior to releasing the component carriers from the sacrificial structure, and forming a second part of electrically insulating layer structures of the component carriers after releasing the component carriers from the sacrificial structure.

* * * * *